(12) United States Patent
Huang et al.

(10) Patent No.: US 12,253,574 B2
(45) Date of Patent: Mar. 18, 2025

(54) ADAPTIVE IMPEDANCE TRACKING

(71) Applicant: Advanced Energy Industries, Inc., Denver, CO (US)

(72) Inventors: Chin-Feng Huang, New Taipei (TW); Ping-Yang Lai, Taichung (TW); Sin-You Lin, Taichung (TW); Li-Chung Lin, Luodong Township (TW)

(73) Assignee: Advanced Energy Industries, Inc., Denver, CO (US)

( * ) Notice: Subject to any disclaimer, the term of this patent is extended or adjusted under 35 U.S.C. 154(b) by 259 days.

(21) Appl. No.: 18/147,966

(22) Filed: Dec. 29, 2022

(65) Prior Publication Data
US 2024/0219478 A1 Jul. 4, 2024

(51) Int. Cl.
*G01R 31/40* (2020.01)
*H02M 3/158* (2006.01)
*H01J 1/10* (2006.01)
*H01J 1/14* (2006.01)
*H02J 1/10* (2006.01)
*H02J 1/12* (2006.01)
*H02J 3/46* (2006.01)

(52) U.S. Cl.
CPC ............ *G01R 31/40* (2013.01); *H02M 3/158* (2013.01); *H01J 1/10* (2013.01); *H01J 1/14* (2013.01); *H02J 1/106* (2020.01); *H02J 1/12* (2013.01); *H02J 3/46* (2013.01); *H02J 3/466* (2020.01); *H02J 3/472* (2020.01)

(58) Field of Classification Search
CPC ...... H02J 1/12; H02J 1/10; H02J 1/106; H02J 1/14; H02J 3/46; H02J 3/466; H02J 3/472; Y10T 307/555
See application file for complete search history.

(56) References Cited

U.S. PATENT DOCUMENTS

| 2012/0033450 A1* | 2/2012 | Shih | H02J 1/102 363/21.01 |
| 2017/0180006 A1* | 6/2017 | de Hoog | H02J 1/14 |
| 2018/0102646 A1* | 4/2018 | Apte | H02J 1/14 |
| 2023/0299583 A1* | 9/2023 | Lumanog | H02J 1/102 700/295 |

FOREIGN PATENT DOCUMENTS

CN 113507131 A 10/2021

* cited by examiner

*Primary Examiner* — Rexford N Barnie
*Assistant Examiner* — Terrence R Willoughby

(57) ABSTRACT

Current sharing in a power system having multiple PSUs comprises generating and supplying a first power and a second power to a load, and sensing a remote voltage value received by the load based on an accumulation of the first and second powers. The method further comprises determining, by the first PSU, local voltage and current values of the first power, a real impedance value of the first PSU based on the remote voltage value and the local voltage and current values of the first power, and a virtual impedance value of the first PSU based on the real impedance value of the first PSU and a reference impedance value. The method further comprises controlling generation of the first power by the first PSU based on the virtual impedance value of the first PSU.

20 Claims, 3 Drawing Sheets

ADAPTIVE IMPEDANCE TRACKING

TECHNICAL FIELD

Aspects of the disclosure relate to output power distribution, and more particularly to systems having multiple power supply units (PSUs) coupled together to provide joint output power to a load.

BACKGROUND

In many power supply applications, in order to achieve improved performance in reliability and efficiency, current-sharing operation is used to balance output current among all power supplies in a multi-PSU system. However, due to varied impedance between the output channels in the system, the output voltage of every PSU is not equal. Without employing a current-sharing control method, the PSU of the multi-PSU system having a higher output voltage will provide more output current. Eventually, total output current will be contributed by a single PSU (e.g., the one having highest output voltage), which causes its output current to exceed its capacity and to shut down accordingly.

One method of controlling current sharing in a system is an active current-sharing mode. In this mode, the multiple PSUs are controlled in a master-slave relationship including setting the PSU that delivers the largest current as the master while setting all other PSUs as slaves. The information about the master's output is shared with the slave PSUs via a share bus. Based on the shared information, the slave PSUs actively adjust their output voltage to try to achieve current balance. Since the relation of output voltage to the output sharing current is unknown, each slave PSU adjusts its output voltage slowly. This can lead to unilateral behavior where the master PSU waits for the slave PSUs to catch up. Efficiency, therefore, can be undesirable.

In another method of controlling current sharing, a passive current-sharing mode can be used where each PSU controls its output based on its own information. For example, the larger the current it delivers, the lower the output voltage it provides. In this mode, the PSU does not know whether equilibrium has been reached. Accordingly, a gap in output current delivery may result due, in part, to divergence of impedance among the PSUs.

It would therefore be advantageous to have a multi-PSU system that overcomes the aforementioned drawbacks.

SUMMARY

In accordance with one aspect of the present disclosure, a method for current sharing in a power system having multiple power supply units (PSUs), the method comprises generating a first power by a first PSU and supplying the first power to a load, generating a second power by a second PSU and supplying the second power to the load, and sensing a remote voltage value received by the load based on an accumulation of the first power and the second power. The method further comprises determining, by the first PSU, a local voltage value of the first power, a current value of the first power, a real impedance value of the first PSU based on the remote voltage value, the local voltage value of the first power, and the current value of the first power, and a virtual impedance value of the first PSU based on the real impedance value of the first PSU and a reference impedance value. The method further comprises controlling generation of the first power by the first PSU based on the virtual impedance value of the first PSU.

In accordance with another aspect of the present disclosure, a power system comprises a first power supply unit (PSU) and a second PSU. The first PSU comprises a first power generation device and a first controller configured to control the first power generation device to generate a first power and supply the first power to a load. The second PSU comprises a second power generation device and a second controller configured to control the second power generation device to generate a second power and supply the second power to the load. The load is configured to determine a received voltage value based on receiving the first power and the second power. The first controller is further configured to determine a voltage value and a current value of the first power, to determine a real impedance value of the first PSU based on the received voltage value and the voltage and current values of the first power, to determine a virtual impedance value of the first PSU based on the real impedance value and a reference impedance value, and to control the first power generation device based on the virtual impedance value to generate the first power.

BRIEF DESCRIPTION OF THE DRAWINGS

The drawings illustrate embodiments presently contemplated for carrying out the invention.

In the drawings.

Figure 1:
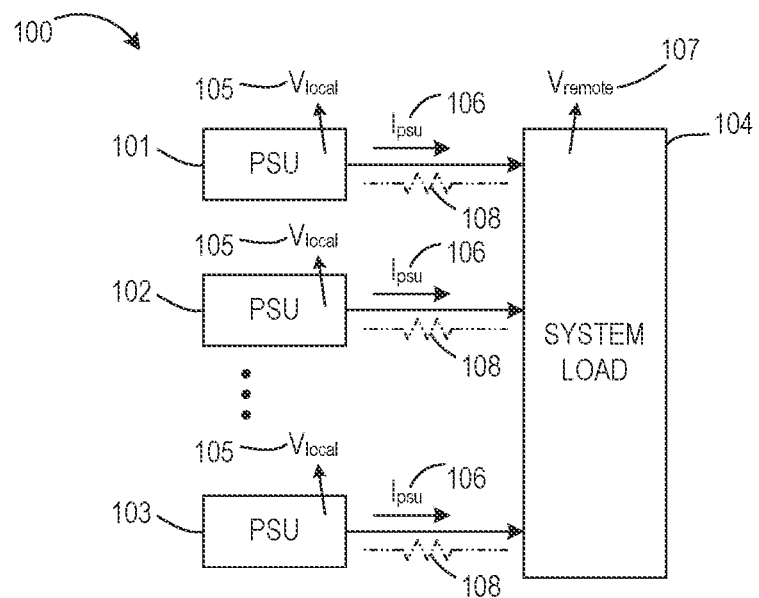
FIG. 1 illustrates a multi-PSU system according to an embodiment.

While the present disclosure is susceptible to various modifications and alternative forms, specific embodiments thereof have been shown by way of example in the drawings and are herein described in detail. It should be understood, however, that the description herein of specific embodiments is not intended to limit the present disclosure to the particular forms disclosed, but on the contrary, the intention is to cover all modifications, equivalents, and alternatives falling within the spirit and scope of the present disclosure. Note that corresponding reference numerals indicate corresponding parts throughout the several views of the drawings.

DETAILED DESCRIPTION

Examples of the present disclosure will now be described more fully with reference to the accompanying drawings. The following description is merely exemplary in nature and is not intended to limit the present disclosure, application, or uses.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Although the disclosure hereof is detailed and exact to enable those skilled in the art to practice the invention, the physical embodiments herein disclosed merely exemplify the invention which may be embodied in other specific structures. While the preferred embodiment has been described, the details may be changed without departing from the invention, which is defined by the claims.

FIG. 1 illustrates a multi-power supply unit (PSU) system 100 according to an embodiment. A plurality of PSUs 101, 102, 103 are coupled to a system load 104 and are configured to supply individual power outputs to the system load 104. The individual power outputs are paralleled so that each PSU 101-103 supplies a portion of the total current to be provided to the system load 104. In a preferred embodiment, each PSU 101-103 provides an equal share of current so that the output current is balanced among all of the power supplies. For example, in a multi-PSU system having three PSUs, each PSU provides one-third of the total current received at the system load 104. Embodiments of this disclosure address impedance variances among the multiple PSUs to maintain substantially equal current sharing and to avoid one of the PSUs from taking over all of the current supply needs, leading to a shutdown of the overachieving PSU.

As illustrated in FIG. 1, each PSU 101-103 supplies its own output power to the system load 104 including an output voltage ($V_{local}$) 105 and an output current ($I_{psu}$) 106. Due, in part, to varied component tolerances, circuit impedances, cables, and the like, the output voltages of the PSUs 101-103 are not equal. Accordingly, the voltage 107 received by the system load 104 can be different from the voltage produced by the individual PSU 101-103. The voltage at the system load 104 is typically less than the voltages produced by the PSUs 101-103 such that a real impedance is experienced between the PSUs 101-103 and the system load 104. A resistor 108 illustrated in phantom is shown in FIG. 1 to graphically illustrate the results of the real impedance. The impedance resistor 108 is not a physical resistor, but its impedance is determinable via Equation 1 below:

$$Z_{real} = \frac{V_{local} - V_{remote}}{I_{psu}}. \quad \text{(Eqn. 1)}$$

In Equation 1, $Z_{real}$ is the impedance of the virtual impedance resistor 108 illustrated in FIG. 1. It is determined by subtracting the voltage ($V_{remote}$) sensed at the remote system load 104 from the output voltage ($V_{local}$) sensed at the PSU 101-103. The difference is then divided by the output current ($I_{psu}$) to determine the real impedance experienced between the PSU 101-103 and the system load 104. As explained herein, the real impedance is used to encourage full current sharing among the PSUs 101-103.

Figure 2:
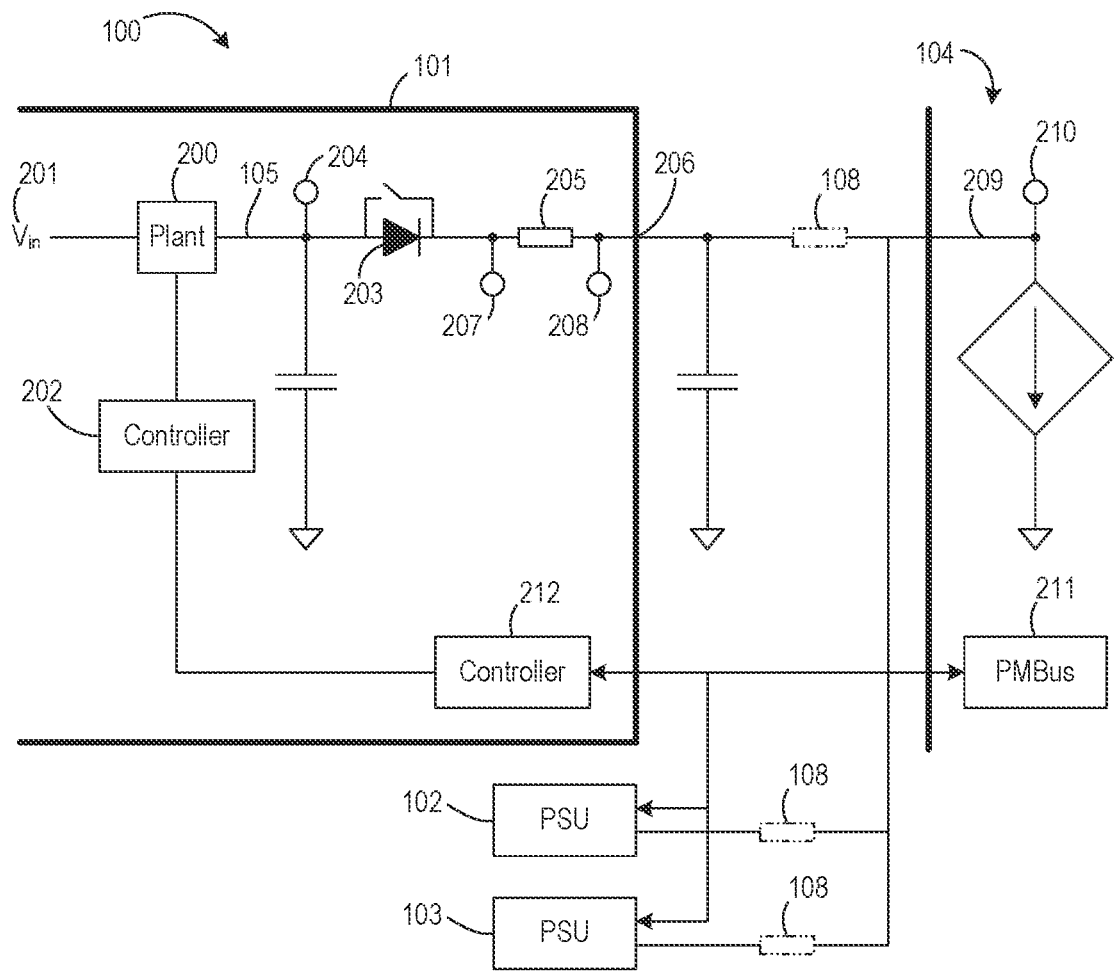
FIG. 2 is a schematic diagram illustrating a portion of the multi-PSU system of FIG. 1 according to an embodiment.

FIG. 2 is a schematic diagram illustrating a portion of the multi-PSU system 100 of FIG. 1 according to an embodiment. FIG. 2 illustrates additional details with respect to PSU 101 not illustrated in the blocks for PSUs 102, 103 to simplify the drawing of FIG. 2. However, it is understood that PSUs 102, 103 may include the same details described for PSU 101.

The PSU 101 includes a voltage conversion plant 200 configured to convert an input voltage 201 into output voltage 105 for delivery to the system load 104. The plant 200 may be any type of voltage converter such as a forward converter, an LLC converter, a buck/boost converter, or the like in a single, multi-interleaved, or multi-parallel configuration according to the design needs of the PSU 101. A controller 202 coupled to the plant 200 is configured to control one or more switches (not shown) in the plant 200 to convert the input voltage 201 into the output voltage 105.

The paralleled PSU 101 supplies its output voltage 105 through an ORing switch 203 such as a diode or a MOSFET. A measurement point 204 coupled to the output of the plant 200 is configured to provide a measurement of the output voltage 105 to obtain the local voltage ($V_{local}$) of the PSU 101. In one embodiment, a current sense resistor 205 in series with the output power delivered through a power output 206 to the system load 104 is provided to sense the output current 106. Measurement points 207, 208 allow the voltage across the current sense resistor 205 to be measured, which can be used to calculate the output current 106 based on a known value of the impedance of the current sense resistor 205. In one embodiment, the controller 202 receives the locally measured voltage and current to be used in the calculations described hereinbelow.

The system load 104 includes an input power node 209 that receives the output voltages 105 and output currents 106 of all PSUs 101-103. A combined input voltage ($V_{remote}$) of the output powers supplied by the PSUs 101-103 is measured at a measurement point 210 by ADC channel of the PSUs 101-103. In one embodiment, the PSU 101 includes a communication controller 212 coupled with the PMBus 211 for sensing remote voltage by the system load 104. The communication controller 212 in turn communicates with the controller 202 to provide the sensed remote voltage. In another embodiment, communication controller 212 is not provided, and the controller 202 may itself sense the sensed remote voltage in a single-controller arrangement. With the local voltage, remote voltage, and output current values known, the controller 202 may calculate the real impedance ($Z_{real}$) of the PSU 101 using Eqn 1.

Figure 3:
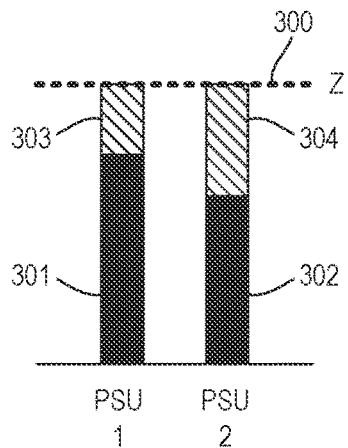
FIG. 3 illustrates different impedances of multiple PSUs according to an embodiment.

According to embodiments of this disclosure, a constant, reference impedance Z is determined as a reference for impedance tracking by the individual PSUs 101-103. As illustrated in FIG. 3, the reference impedance Z 300 is a combination of a real impedance ($Z_{real}$) 301, 302 and a virtual impedance ($Z_{virtual}$) 303, 304. The difference between a PSU's real impedance and the reference impedance Z is the PSU's virtual impedance. For example, Eqn. 2 illustrates calculation of the virtual impedance ($Z_{virtual}$) of an individual PSU 101-103.

$$Z_{virtual} = Z - Z_{real} \quad \text{(Eqn. 2)}$$

As illustrated in FIG. 3, the real impedance 301 of the PSU 101 is greater than the real impedance 302 of the PSU 102. However, both real impedances 301, 302 are below the reference impedance Z 300. Accordingly, each PSU 101, 102 has its corresponding virtual impedance 303, 304. According to embodiments of this disclosure, the value of the reference impedance Z 300 is chosen or selected such that each PSU in the multi-PSU system 100 has some amount of virtual impedance. Choosing the reference impedance Z 300 in this manner promotes equalized current sharing among the PSUs 101-103.

Figure 4:
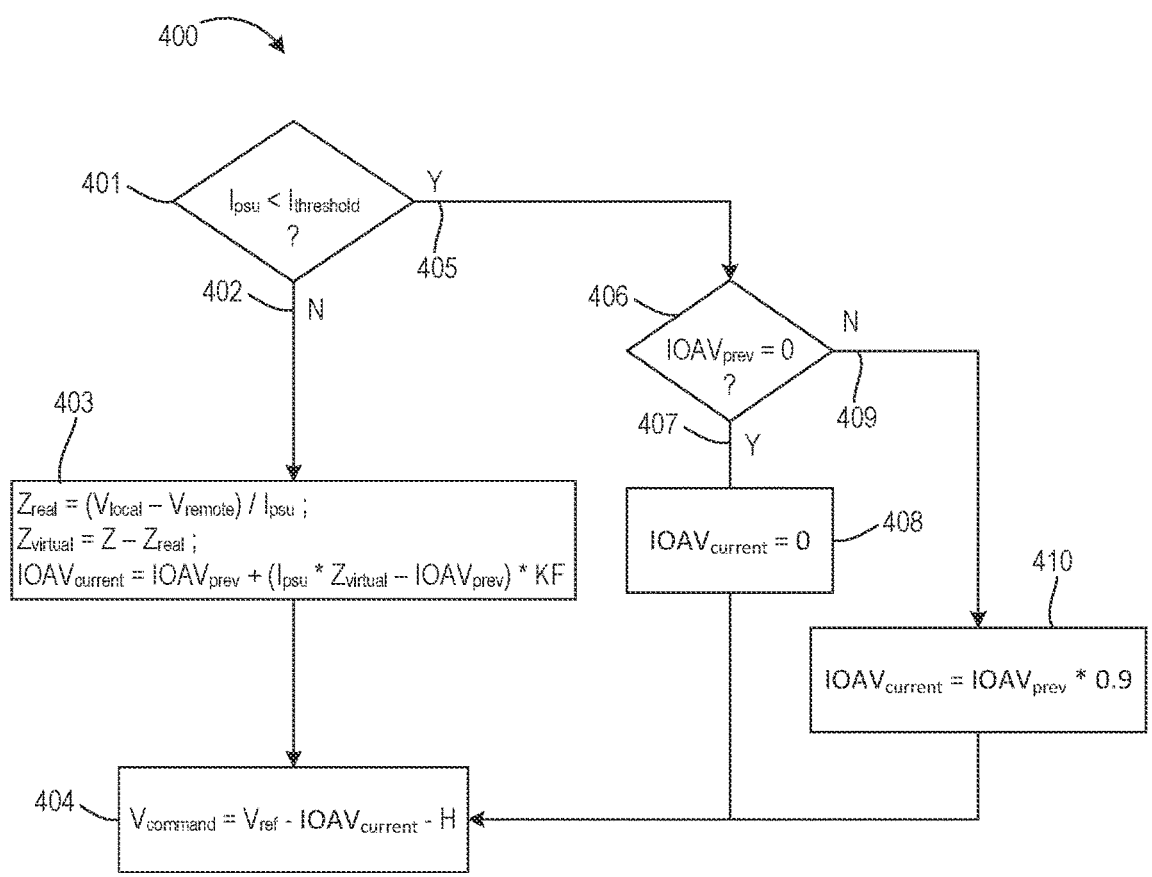
FIG. 4 illustrates a flowchart for adjusting a control voltage for a single PSU of the multi-PSU system of FIG. 1 according to an embodiment.

FIG. 4 illustrates a control voltage adjustment procedure 400 for adjusting the control voltage of a single PSU of the multi-PSU system of FIG. 1 according to an embodiment.

The procedure 400 may be implemented by the controller 202 of each PSU 101-103 to adjust the control of the plant 200 based on equalizing current sharing among the PSUs 101-103.

The procedure 400 determines (STEP 401) whether the output current 106 is less than a predetermined current threshold ($I_{threshold}$). The current threshold may be a small value such as 0.5 amps, 0.2 amps, or the like. STEP 401 helps the controller 202 to determine whether any output current 106 is being produced by the plant 200. If the output current is above the threshold (402), the calculation (STEP 403) of a current value of a voltage adjustment (integrator of adjusting voltage, $IOAV_{current}$) is begun based on Eqns. 1 and 2 above. STEP 403 employs Eqns. 1 and 2 to calculate the virtual impedance ($Z_{virtual}$) of the PSU to which the controller 202 belongs.

The current value of the voltage adjustment ($IOAV_{current}$) is thereafter calculated using the virtual impedance ($Z_{virtual}$), the output current ($I_{psu}$), a previous value of the IOAV ($IOAV_{previous}$), and a filter gain (KF) as illustrated in Eqn. 3.

$$IOAV_{current} = IOAV_{previous} + (I_{psu} * Z_{virtual} - IOAV_{previous}) * KF \quad (\text{Eqn. 3})$$

Using the calculated current value of the voltage adjustment ($IOAV_{current}$), at least a portion of the voltage command ($V_{command}$) used by the controller 202 to control the plant 200 is calculated (STEP 404) via Eqn. 4.

$$V_{command} = V_{ref} - IOAV_{current} \pm H, \quad (\text{Eqn. 4})$$

where H corresponds with feedback control appropriate for the type of plant 200 used in the PSU 101-103. H, for example, may be PID control used to adjust the voltage command based on the actual voltage produced.

Returning to STEP 401, if the output current 106 is less than the predetermined current threshold (405), the previous value of the IOAV is checked to see if its value is zero (STEP 406). If the value is zero (407), the current value of the IOAV is set to zero (STEP 408), and control passes to STEP 404 for calculation of the voltage command ($V_{command}$). If the previous value of the IOAV is not zero (409), the current value of the IOAV is set (STEP 410) to the previous value of the IOAV multiplied by a reducing value (e.g., 0.9 as illustrated in FIG. 4). This helps to reduce abrupt or dramatic changes in the $V_{command}$ signal, especially during transient loading conditions. Control then passes to STEP 404 for calculation of the voltage command ($V_{command}$).

Figure 5:
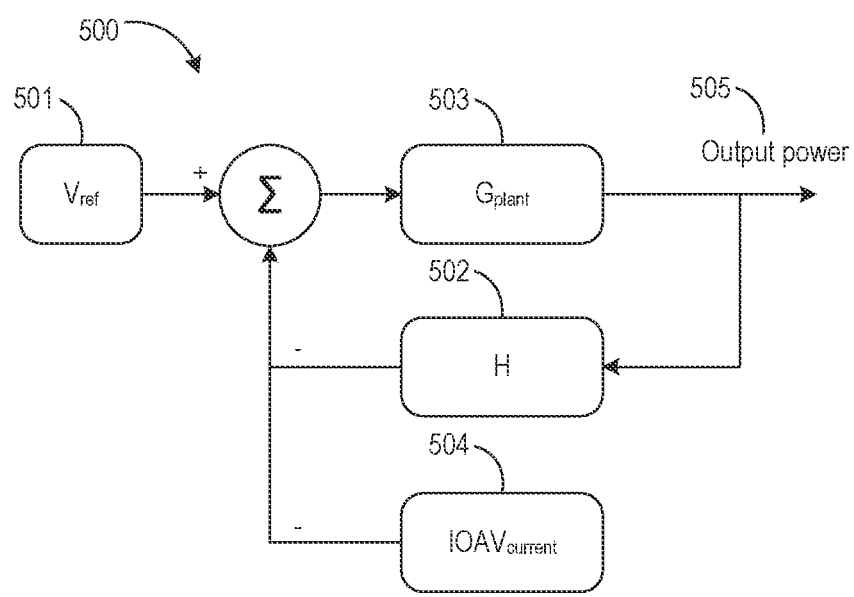
FIG. 5 illustrates a control diagram for a single PSU of the multi-PSU system of FIG. 1 according to an embodiment.

FIG. 5 illustrates a control diagram 500 employable by the controller 202 for generating the output power according to an embodiment. As described above with respect to FIG. 4 and Eqn. 4, a voltage reference 501 is modified by a feedback loop H 502 appropriate for the type of plant 503 used in the PSU 101-103 and modified by a current value of the IOAV 504. As a result, the output power 505 generated by the plant 503 includes an output current that is closely matched with the output currents produced by the other PSUs in the multi-PSU system 100.

Embodiments of this disclosure provide for equal current distribution among the multiple PSUs used such that no one PSU assumes the task of providing all of the current to the system load. In this manner, each PSU provides its equalized share of total output current of 1/N, where N is the number of PSUs in the multi-PSU system.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the invention is not to be seen as limited by the foregoing description but is only limited by the scope of the appended claims.

The invention claimed is:

1. A method for current sharing in a power system having multiple power supply units (PSUs), the method comprising:
   generating a first power by a first PSU and supplying the first power to a load;
   generating a second power by a second PSU and supplying the second power to the load;
   sensing a remote voltage value received by the load based on an accumulation of the first power and the second power;
   determining, by the first PSU:
     a local voltage value of the first power;
     a current value of the first power;
     a real impedance value of the first PSU based on the remote voltage value, the local voltage value of the first power, and the current value of the first power; and
     a virtual impedance value of the first PSU based on the real impedance value of the first PSU and a reference impedance value; and
   controlling generation of the first power by the first PSU based on the virtual impedance value of the first PSU.

2. The method of claim 1 further comprising setting the reference impedance value greater than the real impedance value of the first PSU.

3. The method of claim 2 further comprising:
   determining, by the second PSU:
     a local voltage value of the second power;
     a current value of the second power; and
     a real impedance value of the second PSU based on the remote voltage value, the local voltage value of the second power, and the current value of the second power; and
     a virtual impedance value of the second PSU based on the real impedance value of the second PSU and the reference impedance value.

4. The method of claim 3 further comprising controlling generation of the second power by the second PSU based on the virtual impedance value of the second PSU.

5. The method of claim 3, wherein the real impedance value of the second PSU is different than the real impedance value of the first PSU.

6. The method of claim 4 further comprising setting the value of the reference impedance value greater than the real impedance value of the second PSU.

7. The method of claim 2, wherein controlling generation of the first power by the first PSU comprises:
   determining an integrator of adjusting voltage (IOAV) value based on the virtual impedance value of the first PSU;
   determining a command voltage value based on a reference voltage value and the IOAV value; and controlling the first PSU by the controller based on the command voltage value to generate the first power.

8. The method of claim 7 further comprising adjusting the IOAV value based on the virtual impedance value of the first PSU in response to the current value of the first power being greater than a current threshold.

9. The method of claim 8 further comprising adjusting the IOAV value based on a reducing factor in response to the current value of the first power being less than the current threshold and the IOAV value being greater than zero.

10. The method of claim 7, wherein the controller is configured to receive the remote voltage value from the load.

11. A power system comprising:
a first power supply unit (PSU) comprising:
a first power generation device; and
a first controller configured to control the first power generation device to:
generate a first power; and
supply the first power to a load;
a second PSU comprising:
a second power generation device; and
a second controller configured to control the second power generation device to:
generate a second power; and
supply the second power to the load;
wherein the load is configured to determine a received voltage value based on receiving the first power and the second power; and
wherein the first controller is further configured to:
determine a voltage value and a current value of the first power;
determine a real impedance value of the first PSU based on the received voltage value and the voltage and current values of the first power;
determine a virtual impedance value of the first PSU based on the real impedance value and a reference impedance value; and
control the first power generation device based on the virtual impedance value to generate the first power.

12. The power system of claim 11, wherein the first controller is further configured to determine the real impedance value by:
calculating a difference between the voltage value and the received voltage value; and
dividing the difference by the current value.

13. The power system of claim 12, wherein the first controller is further configured to determine the virtual impedance value by subtracting the real impedance value from the reference impedance value.

14. The power system of claim 11, wherein the second controller is further configured to:
determine a voltage value and a current value of the second power;
determine a real impedance value of the second PSU based on the received voltage value and the voltage and current values of the second power;
determine a virtual impedance value of the second PSU based on the real impedance value and the reference impedance value; and
control the second power generation device based on the virtual impedance value of the second PSU to generate the second power.

15. The power system of claim 14, wherein the reference impedance value is greater than the real impedance values of the first and second PSUs.

16. The power system of claim 14, wherein the virtual impedance value of the second PSU is different than the virtual impedance value of the first PSU.

17. The power system of claim 14, wherein the first controller is configured to sense the received voltage value from the load.

18. The power system of claim 17, wherein the second controller is configured to sense the received voltage value from the load.

19. The power system of claim 11, wherein the first controller is configured to determine the virtual impedance value based on the equation:

$$Z_{real} = \frac{V_{local} - V_{remote}}{I_{psu}},$$

where $Z_{real}$ is the real impedance value of the first PSU, $V_{local}$ is the voltage value of the first power, $V_{remote}$ is the received voltage value, and $I_{psu}$ is the current value of the first power.

20. The power system of claim 11, wherein the controller is configured to determine the voltage value of the first power by measuring the voltage value of the first power at a power output of the first power generation device; and
wherein the controller is configured to determine the current value of the first power by measuring the current value of the first power supplied to the power output of the first PSU.

* * * * *